United States Patent
Loke et al.

(10) Patent No.: US 9,762,231 B2
(45) Date of Patent: Sep. 12, 2017

(54) TRANSISTORS CONFIGURED FOR GATE OVERBIASING AND CIRCUITS THEREFROM

(71) Applicant: QUALCOMM Incorporated, San Diego, CA (US)

(72) Inventors: Alvin Leng Sun Loke, San Diego, CA (US); Bo Yu, San Diego, CA (US); Stephen Clifford Thilenius, San Diego, CA (US); Reza Jalilizeinali, Carlsbad, CA (US); Patrick Isakanian, El Dorado Hills, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/812,516

(22) Filed: Jul. 29, 2015

(65) Prior Publication Data

US 2016/0269017 A1 Sep. 15, 2016

Related U.S. Application Data

(60) Provisional application No. 62/130,951, filed on Mar. 10, 2015.

(51) Int. Cl.
*H03B 1/00* (2006.01)
*H03K 3/00* (2006.01)
(Continued)

(52) U.S. Cl.
CPC ... *H03K 17/0822* (2013.01); *H03K 19/00315* (2013.01); *H03K 19/018521* (2013.01)

(58) Field of Classification Search
CPC .................................................. H03K 17/0822
(Continued)

(56) References Cited

U.S. PATENT DOCUMENTS 6,121,795 A 9/2000 Curd et al.
6,429,716 B1 * 8/2002 Drapkin ........... H03K 19/00315
 323/313
(Continued)

FOREIGN PATENT DOCUMENTS

JP H05152930 A 6/1993
WO WO-2010077233 A1 7/2010

OTHER PUBLICATIONS

International Search Report and Written Opinion—PCT/US2016/017733 ISA/EPO—May 4, 2016.

*Primary Examiner* — Lincoln Donovan
*Assistant Examiner* — Metasebia Retebo
(74) *Attorney, Agent, or Firm* — Loza & Loza, LLP/Qualcomm

(57) ABSTRACT

An electronic circuit and methods of operating the electronic circuit are provided. The electronic circuit includes a pull-up transistor for pulling up an input/output (I/O) node of the output circuit to a first voltage and a first isolation transistor for coupling the pull-up transistor to the I/O node. The electronic circuit also includes a pull-down transistor for pulling down the I/O node to a second voltage and a second isolation transistor for coupling the pull-down transistor to the I/O node. In the electronic circuit, the pull-up and the pull-down transistors are transistors supporting a first drain-to-source voltage and a first gate-to-source voltage, while the first and the second isolation transistors are transistors supporting the first drain-to-source voltage and a second gate-to-source voltage greater than the first gate-to-source voltage.

24 Claims, 5 Drawing Sheets

(51) Int. Cl.
*H03K 17/082* (2006.01)
*H03K 19/003* (2006.01)
*H03K 19/0185* (2006.01)

(58) Field of Classification Search
USPC .......................................................... 327/112
See application file for complete search history.

(56) References Cited

U.S. PATENT DOCUMENTS

| | | |
|---|---|---|
| 7,193,441 B2 | 3/2007 | Chen et al. |
| 7,215,146 B2 | 5/2007 | Khan |
| 7,375,555 B1 | 5/2008 | Wang et al. |
| 7,724,026 B1 | 5/2010 | Tan |
| 7,936,209 B2 * | 5/2011 | Bhattacharya ... H03K 19/01852 327/108 |
| 8,324,934 B1 | 12/2012 | Truong et al. |
| 2007/0007597 A1 | 1/2007 | Yach et al. |
| 2014/0091860 A1 * | 4/2014 | Chen ....................... G05F 1/565 327/540 |

* cited by examiner

400

404

500

TRANSISTORS CONFIGURED FOR GATE OVERBIASING AND CIRCUITS THEREFROM

CROSS-REFERENCE TO RELATED APPLICATIONS

This application claims priority to and the benefit of U.S. Provisional Patent Application No. 62/130,951, entitled "TRANSISTORS CONFIGURED FOR GATE OVERBIASING AND CIRCUITS THEREFROM" and filed Mar. 10, 2015, the contents of which are hereby incorporated by reference in their entirety.

BACKGROUND

Field

Aspects of the present disclosure relate generally to input/output (I/O) circuits for off-chip communication for integrated circuits (ICs), and more particularly, to lower capacitance of high performance I/O circuits for ICs using transistors configured for gate overbiasing.

Background

In a typical complementary MOSFET (CMOS) IC, I/O is supported via a set of pads, commonly disposed along the periphery of the IC. In the case of pads providing output signals, these pads are typically coupled to the core logic circuits of the IC via one or more output buffer or driver circuits. However, these driver circuits may be exposed to high voltages via the pads and these high voltages could damage other circuits in the IC. Therefore, in order to protect these circuits in the IC from these high voltages, a driver circuit is typically implemented using higher voltage (i.e., higher gate-to-source and drain-to-source voltages), thick-oxide transistors provided by the semiconductor technology node, instead of the typical low voltage, thin-oxide core transistors utilized for the core logic. In such a configuration, the thick oxide protects other circuits in the IC from high voltages at the I/O pad. The thick oxide results in larger physical separation between gate and channel charge in a transistor and as such, thick-oxide transistors have weaker drive currents than thin-oxide transistors. Consequently, the introduction of the thick oxide devices may add a significant amount of capacitance at the I/O pad of the IC, resulting in I/O pads failing to meet the performance requirements for some semiconductor technology nodes.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

One aspect of the present disclosure involves an electronic circuit. The electronic circuit includes a pull-up transistor for pulling up an I/O node of the output circuit to a first voltage and a first isolation transistor for coupling the pull-up transistor to the I/O node. The electronic circuit also includes a pull-down transistor for pulling down the I/O node to a second voltage and a second isolation transistor for coupling the pull-down transistor to the I/O node. In the electronic circuit, the pull-up and the pull-down transistors may be first metal-oxide-semiconductor transistor (MOSFET) devices supporting a first maximum drain-to-source voltage and a first maximum gate-to-source voltage, and wherein the first and the second isolation transistors comprise second MOSFET devices supporting the first maximum drain-to-source voltage and a second maximum gate-to-source voltage greater than the first maximum gate-to-source voltage.

A second aspect of the present disclosure involves an IC that includes internal circuitry, an input/output (I/O) pad, an input driver for providing an input signal at the I/O pad to the internal circuitry, and an output driver for providing an output signal from the internal circuitry to the I/O pad. The output driver includes a pull-up transistor and a pull-down transistor for selectively pulling-up or pulling-down the output node to first and second reference voltages, respectively, a first isolation transistor for selectively isolating the pull-up transistor from the I/O pad, and a second isolation transistor for selectively isolating the pull-down transistor from the I/O pad. In the IC, the pull-up and the pull-down transistors may be first metal-oxide-semiconductor transistor (MOSFET) devices supporting a first maximum drain-to-source voltage and a first maximum gate-to-source voltage, and wherein the first and the second isolation transistors comprise second MOSFET devices supporting the first maximum drain-to-source voltage and a second maximum gate-to-source voltage greater than the first maximum gate-to-source voltage.

A third aspect of the present disclosure involves a method for protecting an output driver coupled to a input/output (I/O) pad of an integrated circuit (IC) and including pull-up and pull-down transistors comprising first metal-oxide-semiconductor transistor (MOSFET) devices supporting a first maximum drain-to-source voltage and a first maximum gate-to-source voltage and configured for selectively pulling-up or pulling-down the I/O pad to first and second voltages, respectively. The method includes providing a first isolation circuit for coupling the pull-up transistor to the I/O pad and a second isolation transistor for coupling the pull-down transistor to the I/O pad, each of the first and the second isolation transistors comprising second MOSFET devices supporting the first maximum drain-to-source voltage and a second maximum gate-to-source voltage greater than the first maximum gate-to-source voltage. The method also includes deactivating the first and the second isolation transistors when the I/O pad is being used in an input mode and activating the first and the second isolation transistors when the I/O pad is being used in an output mode.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The present disclosure is related to improved I/O circuits with buffer or driver circuits configured to protect other circuits in an IC from high voltages present at an associated I/O pad, while achieving low capacitance and high performance. For convenience, these improved I/O circuits will be described in the context of buffer or driver circuits for off-chip communications for an IC. However, it is understood that techniques described herein may have other applications, as will be explained further below.

Figure 1:
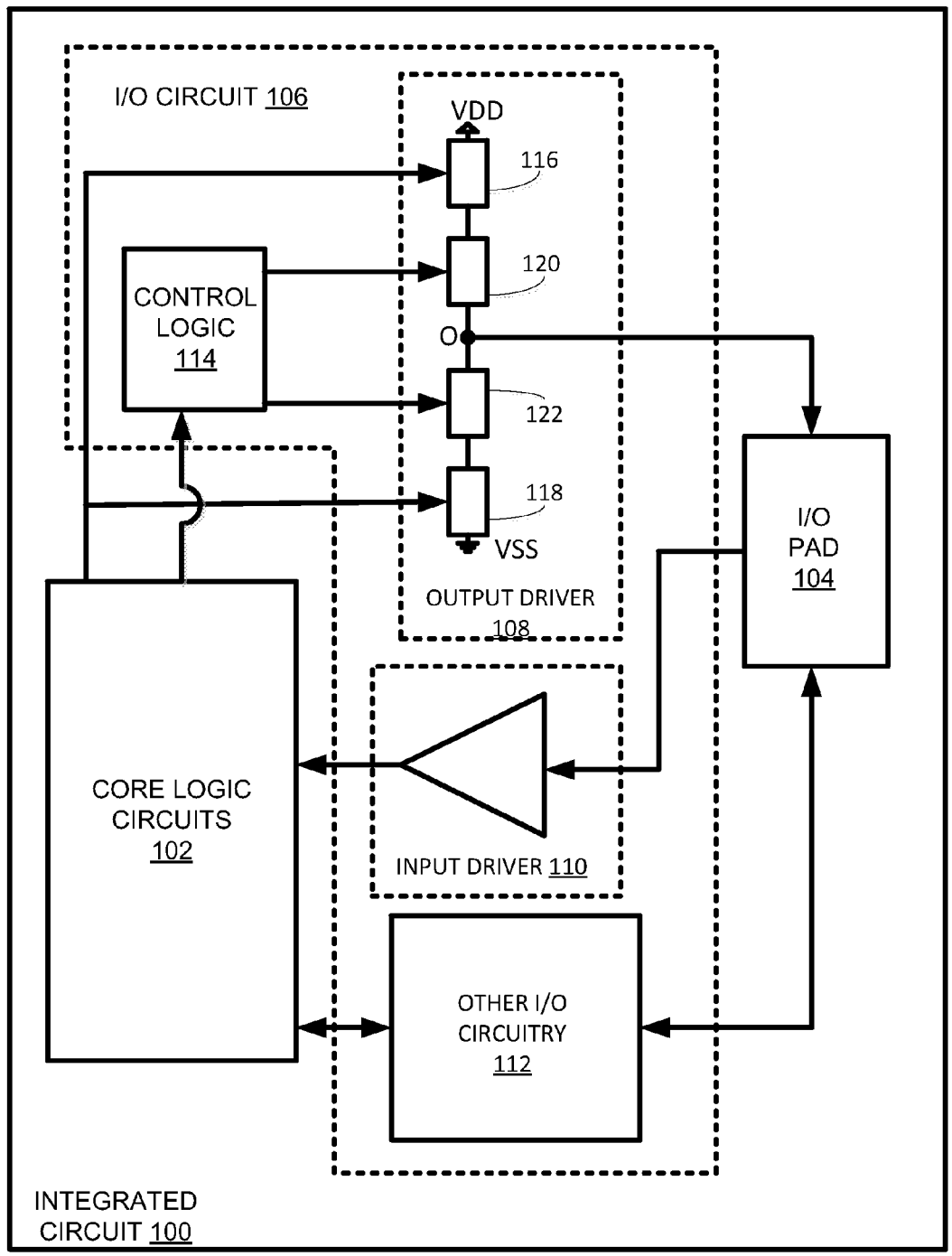
FIG. 1 shows block diagram of an IC configured according to an aspect of the present disclosure.

To provide a better foundation for understanding the various aspects of the present disclosure, reference is first made to FIG. 1, which illustrates an integrated circuit configured in accordance with the present disclosure.

FIG. 1 shows block diagram of an IC 100 configured according to an aspect of the present disclosure. As shown in FIG. 1, the IC 100 includes core logic circuits 102, at least one I/O pad 104, and an I/O circuit 106 coupling the core logic circuits 102 to the I/O pad 104 to support off-chip communications for the core logic circuits 102 via I/O pad 104. The off-chip communications via I/O pad 104 may include receiving input signals from off-chip components, sending output signals to off-chip components, or both. To support the off-chip communications described above, the I/O circuit 106 may include an output driver 108, an input driver 110, and other components, such as control logic 114 and other I/O circuitry 112 coupled to the I/O pad 104 and/or the core logic circuits 102.

In some aspects, the input driver 110 may be configured to receive off-chip input signals from I/O 104 and relay the input signals to the core logic circuits 102. In some aspects, the input driver 110 may be configured as an amplifier circuit or other circuit configured to convert the voltage and/or current of the input signal at I/O pad 104 into a signal with a voltage and current suitable for the core logic circuits 102.

Similarly, the output driver 108 may also be configured in some aspects as an amplifier circuit to convert the voltage and/or current of an output signal from the core logic circuits 102 into a signal with a voltage and current suitable for off-chip communication. For example, as shown in FIG. 1, the output driver 108 can include a pull-up circuit 116 and a pull-down circuit 118 that receive the output signal from the core logic circuits 102. Based on this output signal, the pull-up circuit 116 and the pull-down circuit 118 are operated so as to produce a signal at output node O corresponding to VDD (or some portion thereof) or to VSS (or some portion thereof) that is passed to I/O pad 104.

In some aspects, the output driver 108 may also include isolation circuits 120 and 122 for isolating circuits 116 and 118, respectively, from output node O (and thus from I/O pad 104). In some aspects, the isolation circuits 120 and 122 can be operated using control logic 114. The control logic 114 may be configured such that when core logic circuits 102 intend to utilize I/O pad 104 as an input pad, the control logic 114 generates signals for isolation circuits 120 and 122 to isolate circuits 116 and 118 from I/O pad 104. The control logic 114 may also be configured such that when core logic circuits 102 intend to utilize I/O pad 104 as an output pad, the control logic 114 generates signals for isolation circuits 120 and 122 to couple circuits 116 and 118 to output node O and thus to I/O pad 104.

In some aspects there may be other isolation circuits (not shown) to isolate input driver 110 and/or the other I/O circuitry 112 when I/O pad 104 is to be utilized in an output mode. In some aspects, the control logic 114 may also be used to operate such other isolation circuits. However, the present disclosure contemplates that other components in IC 100 may also be used as well.

In some aspects, the control logic 114 may generate control signals for isolation circuits 120 and 122 based on signals from core logic circuits 102, as shown in FIG. 1. However, the present disclosure contemplates that control logic 114 may be controlled by other components. Further, control logic 114 may be configured to operate in various modes. For example, in one mode, control logic 114 may generate control signals to maintain circuits 116 and 118 isolated from output node O as a default. Thus, control logic 114 only generates signals to cause circuits 116 and 118 to be coupled to output node O when core logic circuits 102 indicate that an output signal is to be output. Such a mode may be useful when the I/O pad 104 is primarily utilized for input signals or if input signals are commonly received. Such a mode may also be considered a more conservative design, as circuits 116 and 118 (and other circuits beyond) are exposed to voltages at the I/O pad only when the I/O pad 104 is to be used as an input circuit. In another mode, control logic 114 may generate control signals for isolation circuits 120 and 122 to maintain circuits 116 and 118 coupled to output node O as a default. Thus, control logic 114 only generates signals for isolation circuits 120 and 122 to cause circuits 116 and 118 to be isolated from output node O when core logic circuits 102 indicate that an input signal to be received. Such a mode may be useful if the I/O pad 104 is primarily utilized for outputting signals.

It should be noted that although FIG. 1 shows that control logic 114 is located in I/O circuit 106, the present disclosure contemplates that the control logic 114 may be instead located in other components of the IC 100. For example, in some aspects, the control logic 114 may be incorporated into core logic circuits 102.

As previously noted, I/O circuitry for in an IC is typically accomplished by utilizing thick-oxide devices for isolation devices in an output driver. However, as supply voltages continue to be reduced, the presence of thick-oxide devices may make it difficult or impossible to meeting I/O pad specifications for a particular semiconductor technology node. In particular, the relatively large size of thick-oxide devices will introduce a significant capacitance at output node O. This additional capacitance, along with capacitances introduced by I/O pad 104, input driver 110, and the other I/O circuitry 112, can result in a relatively large capacitance being present at output node O, reducing overall device performance.

To address such performance issues, the present disclosure contemplates an improved I/O circuit including an output driver circuit that provides a relatively low capacitance and that operates at low supply voltages, yet still provides the high performance needed for off-chip communications and the protection afforded by thick-oxide devices. In particular, to achieve higher device performance for I/O at lower supply voltages, the present disclosure contemplates configuring the output driver to utilize gate overbiased, thick gate oxide (GO-TGX) transistors.

As noted above, a semiconductor technology node typically provides "core" or thin gate oxide MOSFET devices configured to operate at a low gate-to-source voltage ($V_{GS}$) and a low source-to-drain voltage ($V_{DS}$) (e.g., $V_{GS}=V_{DS}=0.8V$) and thick gate oxide MOSFET devices configured to operate at a high $V_{GS}$ and a high $V_{DS}$ (e.g., $V_{GS}=V_{DS}=1.8V$). A GO-TGX transistor refers to a MOSFET device for a semiconductor technology node that has: (1) a channel length that is substantially less than that of the thick gate MOSFET device but greater than or substantially equal to that of the core MOSFET device and (2) a gate oxide thickness that is substantially greater than that of the core MOSFET device but less than or substantially equal to that of the thick gate oxide MOSFET device. As used herein, the term "substantially" means a value within 10% of the stated value. Such devices are therefore configured to operate such that a maximum $V_{GS}$ supported by the gate oxide (i.e., a maximum $V_{GS}$ without breakdown or other gate oxide reliability concerns) is greater than a maximum $V_{DS}$ supported by the MOSFET channel (e.g., a maximum $V_{DS}$ without significant short channel effects or other channel reliability concerns). Thus, such devices may support overbiasing at the gate electrode relative to the source and drain nodes of the GO-TGX transistor. In one exemplary configuration, the GO-TGX transistor may have a gate oxide thickness substantially equal to that for the thick gate oxide MOSFET device and a channel length substantially equal to the channel length of the core MOSFET. Thus, such a GO-TGX transistor can be operated with at a high $V_{GS}$ and a low $V_{DS}$ (e.g., $V_{GS}=1.8V$, $V_{DS}=0.8V$).

The present disclosure contemplates a new use for GO-TGX transistors. In particular, the fact that such GO-TGX transistors may include a gate oxide thickness that is the same as the gate oxide thickness of thick-oxide devices means that GO-TGX transistors may also be configured to be tolerant to the same gate-to-source voltages as their longer channel non-underdrive counterparts. Thus, the present disclosure contemplates using GO-TGX transistors in the overbiased condition (i.e., $V_{GS}>V_{DS}$) in place of conventional, thick-oxide devices to provide isolation devices that can placed in series with core transistor by configuring the GO-TGX transistors to support the low $V_{DS}$ corresponding to the core transistor). Such GO-TGX transistors also provide reduced capacitances as compared to thick-oxide devices, but can also be configured to maintain a high performance (i.e., provide high drive currents despite the thicker gate oxide thickness).

As to capacitance, the reduction offered by GO-TGX transistors may be easily observed. As is generally known, the parallel-plate capacitance (C) of a gate oxide is given by:

$$C = \frac{\varepsilon \cdot A}{d} = \frac{\varepsilon \cdot W \cdot L}{d}$$

Where $\varepsilon$ is the permittivity of the gate oxide insulator, A is the area of the gate that is the product of the width (W) of the gate and the length (L) of the gate, and d is the thickness of the gate oxide. Based on the foregoing, it is easily observed that if the gate length is reduced by 20-30% (which is typical for GO-TGX transistors), the capacitance is also reduced by 20-30%. Accordingly, this results in a significant change in capacitance for an isolation transistor without affecting the gate voltage tolerance of the isolation transistor.

As to performance, operating a GO-TGX transistor with reduced gate-to-source and drain-to-source voltages would normally result in lower drive currents and thus lower performance as compared to its non-underdrive counterpart. However, such lower performance would be unsuitable for off-chip communication. Accordingly, the present disclosure also contemplates that while an underdrive transistor in an I/O circuit may be operated with a reduced $V_{DS}$, relative the $V_{DS}$ for a thick gate oxide device, the underdrive transistor may also be operated with an increased VGS relative to the core device to overbias the gate of the GO-TGX transistor. That is, the overbiasing is provided to maintain performance (i.e., drive currents) for such GO-TGX transistors relative to their longer channel and higher voltage thick oxide counterparts.

However, due to the thick oxide, the overdriving of the gates is not expected to result in breakdown or premature wear-out of the oxide or other gate-oxide reliability issues. In other words, even though the GO-TGX transistor may be "officially" rated for a lower gate-to-source voltage, the thickness of the gate oxide will still support the higher gate-to-source voltage for a regular thick oxide transistor. Thus, the present disclosure contemplates using application the higher gate-to-source voltage to provide higher drive currents than would be normally obtained for the GO-TGX transistor. Accordingly, the shorter channel length GO-TGX transistor with gate overbiasing recovers much of the performance of the thick-oxide transistor with full drain-to-source biasing without the additional capacitance of the non-underdrive thick-oxide device.

It is worth noting that the increased drive current resulting from the gate overbiasing may exacerbate the hot carrier injection (HCI) mechanism in some semiconductor process nodes. Accordingly, this reliability concern may need to be addressed and confirmed to be tolerable with the increased gate bias in some aspects. However, HCl effects, to a large extent, may not as problematic for a trimmed circuit which provides additional range beyond the standard operating region. Further, if the device drive strength is reduced due to a threshold shift over time, trim legs may be used in the design of a circuit to offset the shift's effects. Thus, unless HCl results in catastrophic failure or significant subthreshold performance degradation impacting leakage, HCl effects may not be a significant consider for designing circuits using GO-TGX transistors with gate overbiasing.

Although the present disclosure is directed primarily to aspects related to an output driver for off-chip communication, the present disclosure contemplates that there are other aspects not involving off-chip communication. Thus, in certain aspects, the methods and techniques described herein can be utilized with any circuit having a node for which lowering capacitance is desired without a significant reduction in performance, i.e., drive current.

Figure 2:
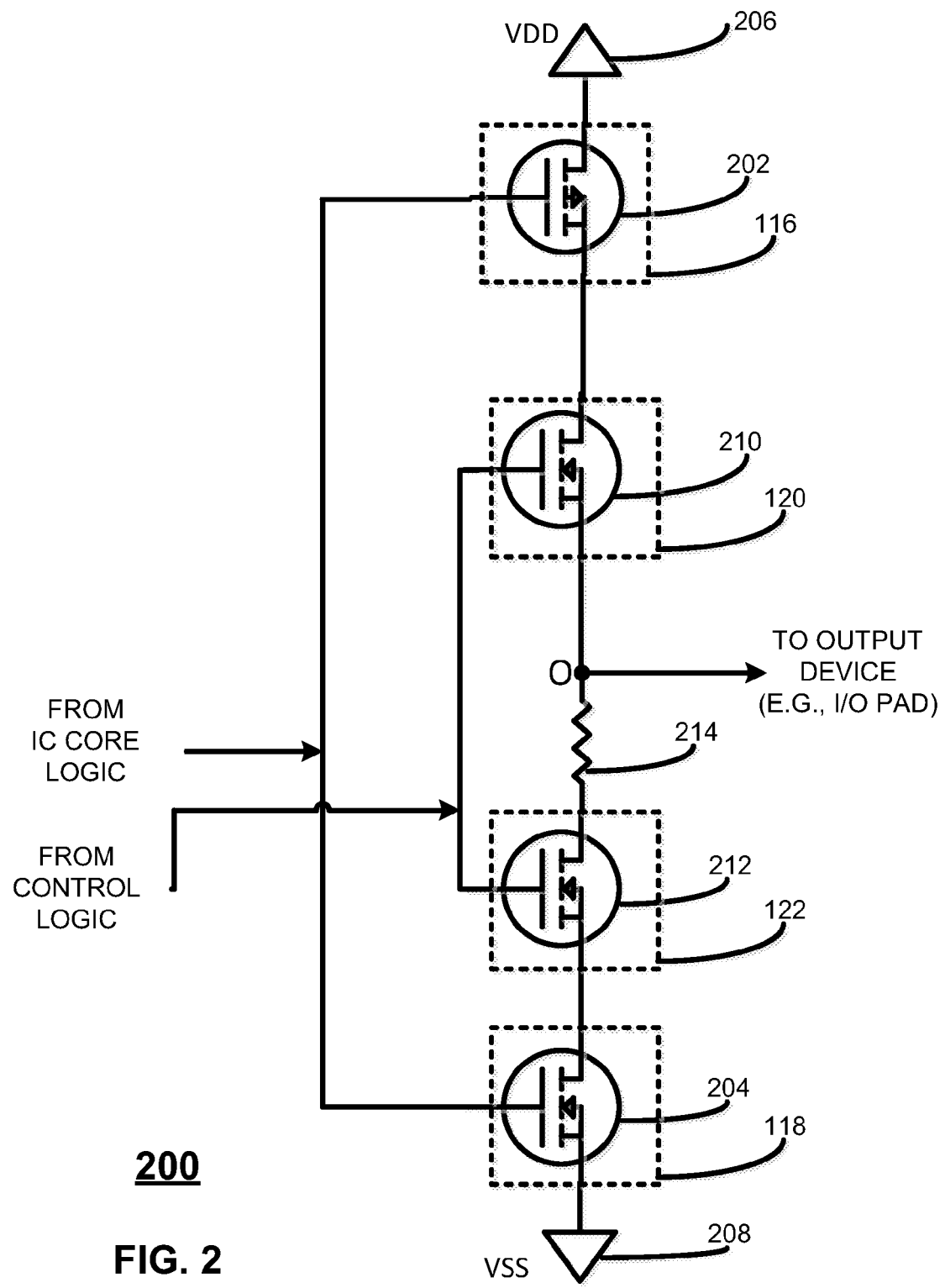
FIG. 2 shows an output driver configured according to an aspect of the present disclosure.

Now turning to FIG. 2, there is shown one exemplary implementation for an output driver 108 in FIG. 1 As shown in FIG. 2, output driver 108 may include as pull-up circuit 116, a pull-up transistor 202 for coupling a supply voltage node 206 (i.e., the VDD node for output driver 108) to an output node O of the output driver 108. Output driver 108 may also include as pull-down circuit 118 a pull-down transistor 204 for coupling a ground or reference voltage node 208 (i.e., the VSS node of output driver 108) to the output node O. Further, the transistors 202 and 204 may be core (i.e., thin-oxide) transistors. That is, transistors 202 and 204 may be thin-oxide transistors configured to operate at low $V_{GS}$ and $V_{DS}$. Accordingly, the voltages for nodes 206 and 208 may be selected to correspond to a voltage difference for the core transistors.

As shown in FIG. 2, the transistors 202 and 204 may be a pull-up PMOSFET and a pull-down NMOSFET respectively. Thus, transistors 202 and 204 may provide a digital MOSFET inverting buffer or driver. In operation, a "1" or "0" signal to be output is received from the IC's core logic (or some intervening circuit), which turns on one of transistors 202 and 204 and turns off the other of transistors 202 and 204. In turn, the output node O is pulled up to the voltage at the supply voltage node 206 or pulled down to the voltage at the ground or reference node 208 based on which of transistors 202 and 204 is currently turned on.

As further shown in FIG. 2, isolation circuits can be provided for each of transistors 202 and 204 to provide an isolation circuit to selectively isolate transistors 202 and 204 from output node O based on a control signal from control logic. For example, as shown in FIG. 2, an isolation circuit for pull-up transistor 202 may be a first isolation transistor 210 coupling pull-up transistor 202 to output node O. Similarly, an isolation circuit for pull-down transistor 204 may be a second isolation transistor 212 coupling pull-down transistor 204 to output node O. In operation, these isolation transistors 210 and 212 can be selectively activated by a same control signal from control logic. However, the present disclosure also contemplates that different control signals can be provided for each of isolation transistors 210 and 212.

As noted above, isolation transistors 210 and 212 may be provided using GO-TGX transistors, but with different bias conditions for $V_{GS}$ and $V_{DS}$. In one exemplary implementation, the $V_{DS}$ is the same as that for the core transistors, i.e., the thin-oxide transistors, while $V_{GS}$ is the same as for the thick-oxide transistors. Thus, the signals from control logic may be the same as would normally be provided for thick-oxide transistors (e.g., 1.8V) but the voltage difference between the supply voltage node 206 and the reference voltage node 208 need only be that required for the core transistors (e.g., 1.2V or 1.5V). Accordingly, as discussed above, this results in increased drive current for the isolation transistors 210 and 212 when these devices are on, yet still enjoying reduced capacitance via the area reduction provided by the reduced channel lengths of the GO-TGX transistors being used for the isolation devices.

As shown in FIG. 2, the isolation transistors 210 and 212 may be implemented using NMOSFET transistors. The present disclosure also contemplates that PMOSFET transistors may also be used. In such cases, the signal from control logic would be inverted to provide the proper control signal for selectively activating the isolation transistors 210 and 212 as needed. However, NMOSFET transistors may be preferred in some aspects for several reasons. One reason may be size. For example, in some technology nodes, NMOSFET devices may be smaller than corresponding PMOSFET devices and thus the amount of area required for the isolation transistors may be minimized. Another reason may be ease of integration. For example, gate overbiasing of NMOSFET devices will typically require biasing of the device and substrate using positive supply voltages and positive supply voltages are more commonly available in an IC. In contrast, gate overbiasing of PMOSFET transistors may require negative bias voltages and special biasing for the substrate which typically must be tied to the most negative voltage in an IC to prevent an inadvertent forward-biasing of junctions. Thus, gate overbiasing of NMOSFET devices may be more easily achieved in a typical IC.

As also shown in FIG. 2, the output driver 108 may also include an impedance matching resistor circuit 214 between the output node O and pull-down transistor 204 to improve the output driver impedance linearity across a wider range of pad voltages. Resistor circuit 214 may be implemented using one or more resistors between output node O and reference node 208. However, such a resistor circuit may not be necessary in some aspects, as gate overbiasing of the GO-TGX transistors can result in the necessary linear impedance across a range of pad voltages. In particular, the pull-down isolation device operates deep in the linear/triode region of operation with gate overbiasing rather than in the saturation region of operation. As a result, the current through of the GO-TGX transistor (and thus the impedance thereof) becomes strongly dependent on voltage. Consequently, with gate overbiasing of the GO-TGX transistors, the output driver 108 may have, in some aspects, excellent impedance linearity without requiring the inclusion of an impedance matching resistor circuit 214.

Output driver 108, as implemented in FIG. 2, operates as follows. First, the control logic may provide a signal to isolation transistors 210 and 212 to turn these devices on if the I/O pad connected to output node O is to be used to provide output signals. For example, in the case of output driver 108, the control logic provides a "1", which turns on isolation transistors 210 and 212. As noted above, since gate overbiasing is needed, the "1" may be provided with a voltage corresponding to thick oxide devices.

Contemporaneously, signals to be output (e.g., one or more "1" and "0" signals) are received from the IC's core logic (or intervening circuits) at the gate nodes of transistors 202 and 204. If a received signal is a "0", the pull-up transistor 202 is turned on and the pull-down transistor 204 is turned off. Thus, since the isolation transistors are turned on, the pull-up transistor 202 can pull the output node O (and thus the I/O pad connected thereto) to the voltage at the supply voltage node 206 (e.g., VDD). If the received signal is a "1", the pull-up transistor 202 is turned off and the pull-down transistor 204 is turned on. Thus, the pull-down transistor 204 can pull the output node O (and thus the I/O pad connected thereto) to the voltage at the reference voltage node 208 (e.g., VDD).

Finally, once there are no more signals to be output or the I/O pad is no longer to be used to provide output signals, e.g., to be used for input signals, the control logic provides a different signal to isolation transistors 210 and 212 to turn them off. For example, in the case of output driver 108, the control logic provides a "0", which turns off isolation transistors 210 and 212.

Figure 3:
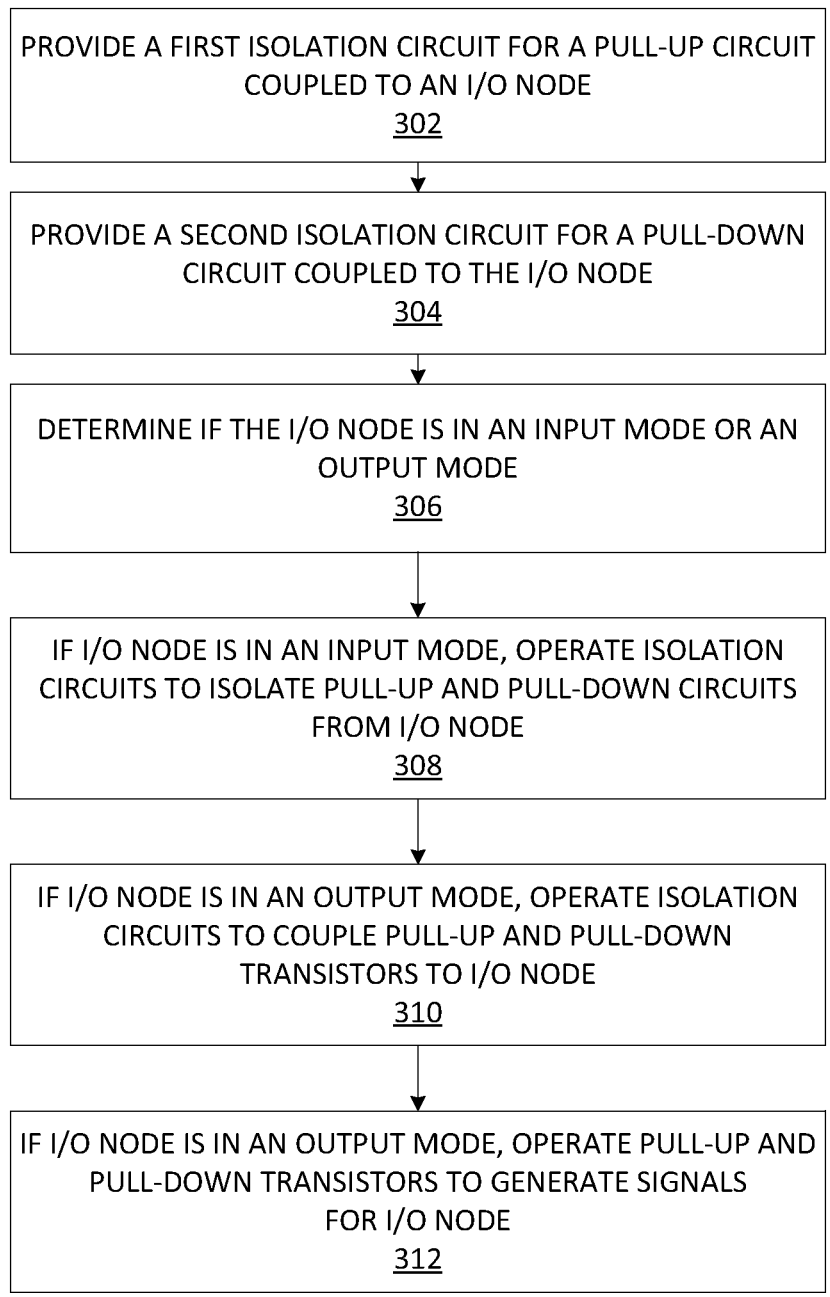
FIG. 3 shows a method of operating an integrated circuit according to an aspect of the present disclosure.

Now turning to FIG. 3, there is shown a method 300 of operating an IC according to an aspect of the present disclosure, such as IC 100. The method 300 may involve, at step 302, providing a first isolation circuit, such as isolation circuit 120, for a pull-up circuit, such as pull-up circuit 116, coupled to an I/O node, such as output node O. The method 300 may also involve, at step 304, providing a second isolation circuit, such as isolation circuit 122, for a pull-down circuit, such as pull-down circuit 118, coupled to an I/O node, such as output node O. As noted above, the isolation circuits may be implemented using GO-TGX transistors, as discussed above with respect to FIG. 2.

The method 300 may further involve, at step 306, determining whether the I/O node should be in an input mode or an output mode. This determination can be made in a couple of ways. For example, referring back to FIG. 1, the control logic 114 can receive a particular signal from the core logic circuits 102 indicating the mode for the I/O node, e.g., the mode for I/O pad 104. Thus, if the particular signal is received, the control logic 114 can determine that the I/O pad is to be used in an output mode instead of an input mode. In another example, control logic 114 can be configured to monitor the signals from the core logic circuits 102 to the output driver 108. If such signals appear to be an output signal, the control logic 114 can determine that the I/O pad is to be used in an output mode instead of an input mode.

Referring back to FIG. 3, the method 300 may involve, at step 308, operating the isolation circuits to isolate the pull-up and pull-down circuits from the I/O node if the I/O node is determined to be in an input mode. For example, referring to FIG. 1, the control logic 114 can generate signals for isolation circuits 120 and 122 to decouple or isolate circuits 116 and 118, respectively, from output node O and I/O pad 104.

The method 300 may also involve, at step 310, operating the isolation circuits to couple the pull-up and pull-down circuits to the I/O node if the I/O node is determined to be in an output mode. For example, referring to FIG. 1, the control logic 114 can generate signals for isolation circuits 120 and 122 to couple circuits 116 and 118, respectively, to output node O and I/O pad 104. As noted above with respect to FIG. 2, the signals are configured to provide gate overbiasing of the underdrive transistors in the isolation circuits.

Finally, the method 300 may involve operating the pull-up and pull-circuits to generate signals for the I/O node if the I/O node is determined to be in an output mode. For example, referring back to FIG. 1, the core logic 114 can generate signals to selectively operate the pull-up circuit 116 and the pull-down circuit 118 to provide voltages to I/O pad 104.

Although the present technology has been described primarily with respect to the implementation of output drivers, the present technology is not limited in this regard. In other aspects, gate overbiasing of underdrive transistors can be utilized in other types of circuits.

Figure 4A:
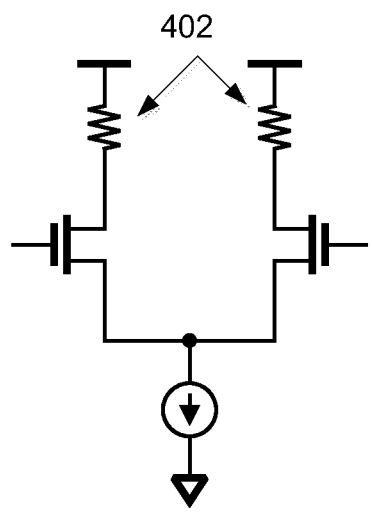
FIG. 4A shows a conventional differential NMOS amplifier.
Figure 4B:
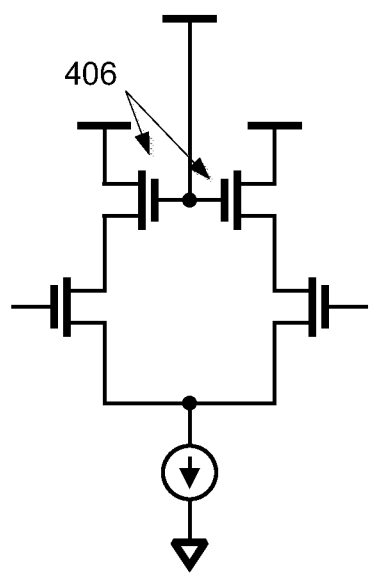
FIG. 4B shows a differential NMOS amplifier according to an aspect of the present disclosure.

For example, GO-TGX transistors with gate overbiasing can be utilized in place of resistors. As noted above, GO-TGX transistors with gate overbiasing operate in the triode region and thus provide an impedance strongly dependent on voltage. In some aspects, this relationship is linear. In one particular example, as shown in FIG. 4A, the resistors 402 in differential NMOS amplifier 400 can be replaced with GO-TGX transistors 406 with gate overbiasing to provide a differential NMOS amplifier 404 with an active load, as shown in FIG. 4B. Moreover, the GO-TGX transistors will typically have a lower resistance than similar sized resistor devices. Accordingly, this means that by using GO-TGX transistors with gate overbiasing in place of conventional resistor devices, low target impedance can be achieved with a design utilizing smaller number of devices in parallel as compared to conventional, resistor-based deigns.

Figure 5:
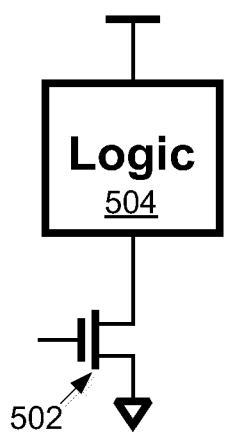
FIG. 5 shows a schematic for utilizing an underdrive transistor with gate overbiasing as a power-gating footer switch according to an aspect of the present disclosure.

In another example, underdrive transistors with gate overbiasing can be used for other types of I/O devices in which the smaller area or capacitance would be beneficial. For example, as shown by the circuit 500 in FIG. 5, an underdrive transistor 502 with gate overbiasing can be used as a power-gating footer switch for core logic 504. Similar to the output drivers discussed above, the underdrive transistor can be utilized as an isolation device between portions of core transistor logic connected together or connected to common circuits. The use of the underdrive transistor thus allows good isolation to be provided while providing a relatively lower capacitance (as in the output driver), especially in the case where portions of core logic with supply VDDs higher than core device tolerances but lower than the gate bias voltage of the underdrive transistor.

Those skilled in the art would appreciate that the various illustrative logical blocks, modules, and circuits described in connection with the disclosure herein may be implemented as electronic hardware, or a combination of electronic hardware and computer software. To clearly illustrate this interchangeability of hardware and software, various illustrative components, blocks, modules, and circuits have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An electronic circuit comprising:
   a pull-up transistor for pulling up an input/output (I/O) node to a first voltage;
   a first isolation transistor for coupling the pull-up transistor to the I/O node;
   a pull-down transistor for pulling down the I/O node to a second voltage; and
   a second isolation transistor for coupling the pull-down transistor to the I/O node,
   wherein the pull-up and the pull-down transistors comprise first metal-oxide-semiconductor transistor (MOSFET) devices supporting a first maximum drain-to-source voltage and a first maximum gate-to-source voltage, and wherein the first and the second isolation transistors comprise second MOSFET devices supporting the first maximum drain-to-source voltage and a second maximum gate-to-source voltage greater than the first maximum gate-to-source voltage, and
   wherein a second gate-to-source voltage is applied at gate electrodes of the first and second isolation transistors, where the second gate-to-source voltage is configured at a voltage level greater than a first gate-to-source voltage of the pull-up and pull-down transistors where the first and second isolation transistors operate in an overbiased condition relative to source and drain nodes of the first and second isolation transistors.

2. The electronic circuit of claim 1, wherein the first drain-to-source operating voltage and the first gate-to-source voltage are the same.

3. The electronic circuit of claim 1, wherein the first drain-to-source operating voltage and the second gate-to-source voltage are configured to cause the second MOSFET devices to operate in a triode region of operation.

4. The electronic circuit of claim 1, wherein the pull-up transistor comprises a P-type MOSFET device and the pull-down transistor comprises a N-type MOSFET device.

5. The electronic circuit of claim 1, wherein each of the first and the second isolation transistors comprises a N-type MOSFET device.

6. The electronic circuit of claim 1, further comprising at least one resistor in series with the second isolation transistor.

7. The electronic circuit of claim 1, further comprising logic for selectively activating the first and the second isolation transistors.

8. The electronic circuit of claim 1, further comprising a resistance circuit in series with the pull-down transistor.

9. An electronic circuit comprising:
a pull-up transistor for pulling up an input/output (I/O) node to a first voltage;
a first isolation transistor for coupling the pull-up transistor to the I/O node;
a pull-down transistor for pulling down the I/O node to a second voltage; and
a second isolation transistor for coupling the pull-down transistor to the I/O node,
wherein the pull-up and the pull-down transistors comprise first metal-oxide-semiconductor transistor (MOSFET) devices supporting a first maximum drain-to-source voltage and a first maximum gate-to-source voltage, and wherein the first and the second isolation transistors comprise second MOSFET devices supporting the first maximum drain-to-source voltage and a second maximum gate-to-source voltage greater than the first maximum gate-to-source voltage where the application of the second maximum gate-to-source voltage at gate electrodes of the first and second isolation transistors is configured to operate the first and second isolation transistors in an overbiased condition; and
wherein each of the first MOSFET devices has a first gate oxide thickness and a first channel length, wherein each of the second MOSFET devices has a second gate oxide thickness and a second channel length, wherein the first and the second channel length are substantially the same, and wherein the second gate oxide thickness is substantially greater than the first gate oxide thickness.

10. An integrated circuit (IC) comprising:
internal circuitry;
an input/output (I/O) pad;
an input means for providing an internal input signal to the internal circuitry based on an external input signal at the I/O pad; and
an output means for providing an external output signal at the I/O node based on an internal output signal from the internal circuitry and a first bias voltage, the output configured for selectively pulling-up or pulling-down the I/O pad to first and second reference voltages, respectively, and
an isolation means for selectively isolating the output means from the I/O pad based on at least one isolation control signal and a second bias voltage; and
wherein the output means is configured to support a first maximum bias voltage for the first bias voltage and a first maximum control voltage for the internal output signal, and
wherein the isolation means is configured to support the first maximum bias voltage for the second bias voltage and a second maximum control voltage greater than the first maximum control voltage for the at least one isolation control signal, wherein the second maximum control voltage is applied at gate electrodes of isolation transistors in the isolation means, where the second maximum control voltage is configured at a voltage level greater than the first maximum control voltage applied to the output means such that the isolation transistors operate in an overbiased condition.

11. The integrated circuit of claim 10, wherein the first drain-to-source operating voltage and the first gate-to-source voltage are the same.

12. The integrated circuit of claim 10, wherein the first drain-to-source operating voltage and the second gate-to-source voltage are configured to cause the second MOSFET devices to operate in a triode region of operation.

13. An integrated circuit (IC) comprising:
internal circuitry;
an input/output (I/O) pad;
an input driver for providing an internal input signal to the internal circuitry based on an external input signal at the I/O pad; and
an output driver for providing an external output signal at the I/O node based on an internal output signal from the internal circuitry, the output driver including a pull-up transistor and a pull-down transistor for selectively pulling-up or pulling-down the I/O pad to first and second reference voltages, respectively, a first isolation transistor for selectively isolating the pull-up transistor from the I/O pad, and a second isolation transistor for selectively isolating the pull-down transistor from the I/O pad; and
wherein the pull-up and the pull-down transistors comprise first metal-oxide-semiconductor transistor (MOSFET) devices supporting a first maximum drain-to-source voltage and a first maximum gate-to-source voltage, and wherein the first and the second isolation transistors comprise second MOSFET devices supporting the first maximum drain-to-source voltage and a second maximum gate-to-source voltage greater than the first maximum gate-to-source voltage, and
wherein a second gate-to-source voltage is applied at gate electrodes of the first and second isolation transistors, where the second gate-to-source voltage is configured at a voltage level greater than the first maximum gate-to-source voltage of the pull-up and pull-down transistors such that the first and second isolation transistors operate in an overbiased condition relative to source and drain nodes of the first and second isolation transistors.

14. The integrated circuit of claim 13, wherein the pull-up transistor comprises a P-type device and the pull-down transistor comprises an N-type device.

15. The integrated circuit of claim 13, wherein each of the first and the second isolation transistors comprise N-type devices.

16. The integrated circuit of claim 13, further comprising at least one resistor in series with the second isolation transistor.

17. The integrated circuit of claim 13, further comprising control logic for selectively activating the first and the second isolation transistors.

18. The integrated circuit of claim 17, wherein the control logic is configured for selectively activating the first and the second isolation transistors in response to a signal from the internal circuitry to the output driver.

19. The integrated circuit of claim 13, wherein each of the first MOSFET devices has a first gate oxide thickness and a first channel length, wherein each of the second MOSFET devices has a second gate oxide thickness and a second channel length, wherein the first and the second channel length are substantially the same, and wherein the second gate oxide thickness is substantially greater than the first gate oxide thickness.

20. A method for protecting an output driver coupled to a input/output (I/O) pad of an integrated circuit (IC) and including pull-up and pull-down transistors comprising first metal-oxide-semiconductor transistor (MOSFET) devices supporting a first maximum drain-to-source voltage and a first maximum gate-to-source voltage and configured for selectively pulling-up or pulling-down the I/O pad to first and second voltages, respectively, the method comprising:

providing a first isolation circuit for coupling the pull-up transistor to the I/O pad and a second isolation transistor for coupling the pull-down transistor to the I/O pad, each of the first and the second isolation transistors comprising second MOSFET devices supporting the first maximum drain-to-source voltage and a second maximum gate-to-source voltage greater than the first maximum gate-to-source voltage and wherein a second gate-to-source voltage is applied at gate electrodes of the first and second isolation transistors, where the second gate-to-source voltage is configured at a voltage level greater than the first maximum gate-to-source voltage of the pull-up and pull-down transistors such that the first and second isolation transistors operate in an overbiased condition relative to source and drain nodes of the first and second isolation transistors; and deactivating the first and the second isolation transistor when the I/O pad is being used in an input mode; and activating the first and the second isolation transistors when the I/O pad is being used in an output mode.

21. The method of claim 20, further comprising determining, via control logic of the IC, whether the I/O pad is in one of the input mode and the output mode based on a signal from a core logic of the IC to the control logic.

22. The method of claim 20, further comprising determining, via control logic of the IC, whether the I/O pad is in one of the input mode and the output mode based on a signal from a core logic of the IC to the output driver.

23. The method of claim 20, further comprising selecting the first drain-to-source operating voltage and the second gate-to-source voltage to cause the second MOSFET devices to operate in a triode region of operation.

24. The method of claim 20, wherein the providing further comprises:

selecting each of the second MOSFET devices to have a channel length substantially the same as a channel length of the first MOSFET devices, and selecting each of the second MOSFET devices to have a gate oxide thickness substantially greater than a gate oxide thickness of the first MOSFET devices.

* * * * *